(12) United States Patent
White

(10) Patent No.: US 6,396,703 B1
(45) Date of Patent: May 28, 2002

(54) EJECTION MECHANISM FOR A RISER CARD

(75) Inventor: Joseph M White, Windsor, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/918,763

(22) Filed: Jul. 30, 2001

(51) Int. Cl.$^7$ .............. H05K 1/14; H05K 7/00; H01R 13/62
(52) U.S. Cl. .............. 361/754; 361/798; 439/157; 439/160
(58) Field of Search .............. 361/752, 753, 361/754, 784, 785, 798, 803; 70/207, 208; 439/62, 152, 157

(56) References Cited

U.S. PATENT DOCUMENTS

| | | | | |
|---|---|---|---|---|
| 3,784,954 A | * | 1/1974 | Grimm et al. .............. | 361/802 |
| 4,511,199 A | * | 4/1985 | Erlam et al. .............. | 439/160 |
| 4,537,454 A | * | 8/1985 | Douty et al. .............. | 439/157 |
| 5,017,149 A | * | 5/1991 | Hatanaka .............. | 439/157 |
| 5,181,857 A | * | 1/1993 | Layser .............. | 439/153 |
| 5,232,374 A | * | 8/1993 | Iino .............. | 439/153 |

\* cited by examiner

Primary Examiner—Jayprakash N. Gandhi

(57) ABSTRACT

A ejection mechanism is provided for disengaging a riser card from a backplane board of a computer system. The mechanism includes an elongate lever having an upper manipulation region, a lower abutting region and a pivot point located between the upper and lower regions. The elongate lever is mounted on a riser card at the pivot and generally extends downward a sufficient distance as to contact the backplane board upon rotation of the lever, and extends upward a sufficient distance to create sufficient leverage for disengaging the riser card. The lever is configured to have a more narrow cross-section at the lower abutting region to facilitate movement of the lower region along the backplane board towards the riser card. To operate the ejection mechanism, the user will apply a pulling force to the upper manipulation arm in a direction away from the riser card. Upon rotation of the lever, the lower abutting region will contact the surface of the backplane board, the mounting location of the pivot on the riser card causes the backplane board surface to interfere with the rotation of lower abutting region. With continued application of the pulling force, the lower abutting region both presses against and translates along the backplane board surface, forcing the pivot point and attached riser card upward.

17 Claims, 3 Drawing Sheets

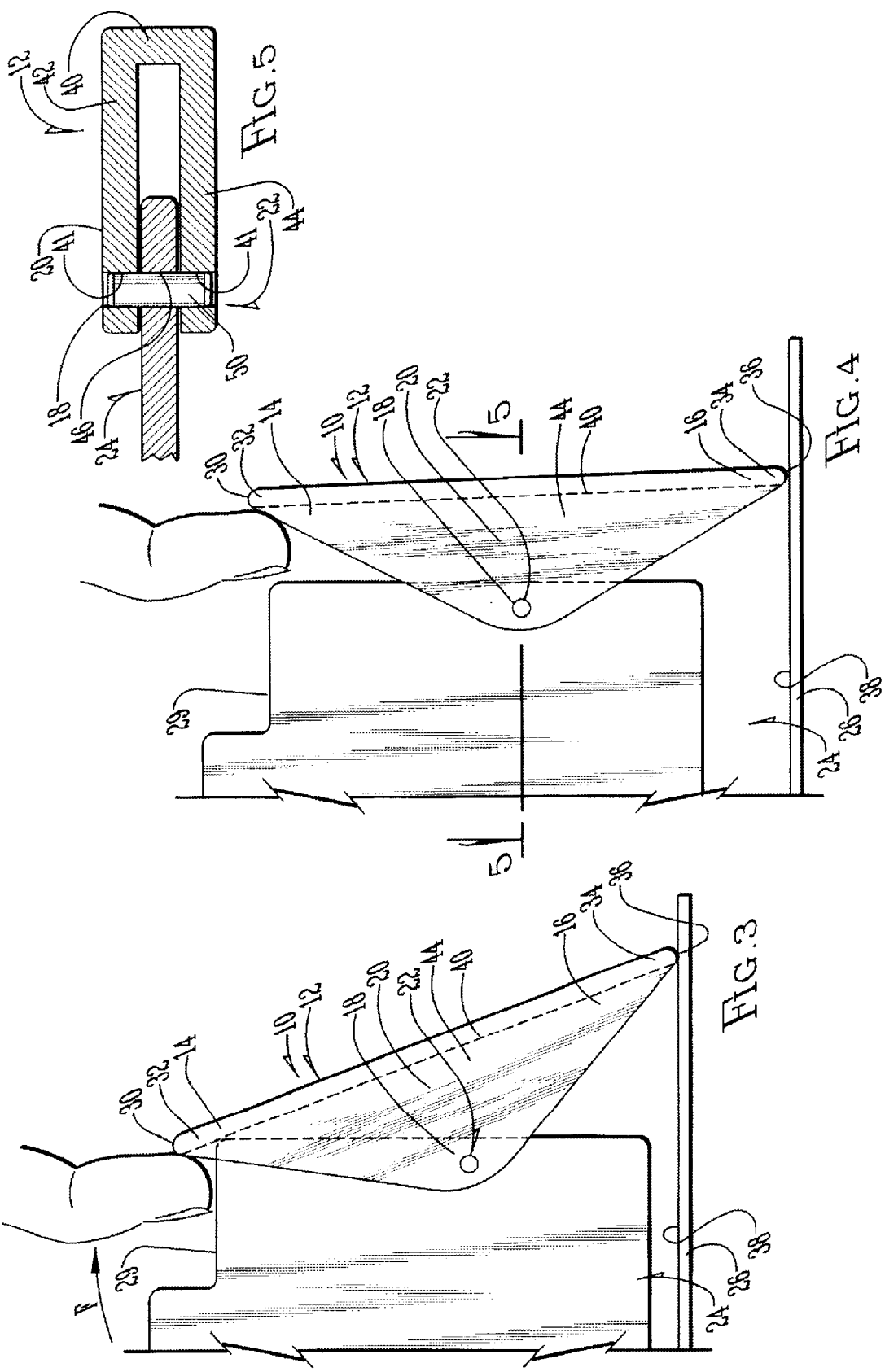

EJECTION MECHANISM FOR A RISER CARD

BACKGROUND OF THE INVENTION

1. Field of the Invention

This invention relates generally to a mechanism facilitating the use of a circuit card with a computer system and, more particularly, to an ejection mechanism for disengaging a riser card from a backplane board.

2. Description of the Related Art

Computer systems are provided with a CPU and related logical circuitry that are typically mounted on a backplane board within a computer chassis. The backplane board is configured to be interfaced with a plurality of printed circuit board assemblies or circuit cards having various electronic components disposed thereon, such as processors or memory chips, to increase the functionality of a computer system. It is often desired to add, replace or remove circuit cards in a computer system if, for example, cards become defective or out of date. As a result, edge connectors are provided for detachably mounting circuit cards on an edge perpendicular to the surface of the backplane board.

While such arrangements securely hold the circuit card in electrical contact with the backplane board, they often make removal of a circuit card difficult. High extraction forces are often required to release the pins of the circuit card from the connector of the backplane board. This problem presents additional difficulty because circuit cards often have delicate componentry that should not be handled manually, thus leaving minimal available area for grasping the card. Furthermore, the situation is exacerbated by the fact that cards are often closely spaced together such that it is difficult to grip an individual card to pull it out of the connector.

To facilitate this removal, various solutions have been proposed for presenting an easier way for disengaging a circuit card from backplane board. In one method, a connector for a circuit card includes a built-in ejector. This method, however, suffers from distinct disadvantages. First, having a built-in ejector adds complexity and cost to a standard connector. Additionally, many built-in ejector designs are hard to use, thus not providing a significant advantage over manually removing the card. Another proposed solution is to place an ejector along the top edge of the circuit card. This provides convenient access to the ejector when multiple cards are installed adjacent to one another. Additionally, this solution provides a lever ejector that only requires rotation in order to remove the circuit card. Despite these advantages, this ejector arrangement requires an additional structure to provide a bearing surface for the lever. This structure is often placed on the backplane board and extend upward roughly the height of the circuit card. This adds cost and complexity to an ejector system. Further, securely attaching the structure to the backplane board to provide a stable bearing surface is difficult. Still further, top edge ejectors typically are relatively small and provide a limited mechanical advantage for disengaging a circuit card.

Thus, what is needed is an apparatus to facilitate disengaging a circuit card edge connector from the electrical connector of the backplane board of a computer system. The apparatus should be easily accessible and operable to lift the pins of an attached circuit card substantially out of a socket connector for a backplane board. Further, the apparatus should be configured to be easily mounted on a circuit card.

SUMMARY OF THE INVENTION

It is thus an object of the present invention to provide an ejector apparatus for effectively disengaging a circuit board from a backplane board such that the circuit board can be easily removed from a computer system. It is a further object of the present invention to provide such an apparatus with a lever to provide sufficient leverage to move the pins of an attached circuit card substantially out of a socket connector of a backplane board. It is a further object of the present invention to arrange the lever such that it is easily accessible when multiple circuit cards are installed on the backplane board. It is yet another object of the present invention to provide a simple structure that can easily be mounted on a circuit card. It is still a further object of the present invention to provide an apparatus that is cost efficient, simple, and universal such that it can be used with many circuit board and backplane designs, and any standard connector configuration.

To accomplish these objects, the present invention provides an apparatus for ejecting a circuit card, and preferably a vertically mounted riser card, from engagement with a backplane board. The apparatus comprises an elongate lever having an upper manipulation region and a lower abutting region, and further comprises an attachment means for pivotably mounting the elongate lever to a riser card.

The attachment means is positioned in a central region of the lever and is configured for pivotal connection with the riser card. As such the lever is movable from a first position wherein the edge connector of the riser card is seated in and electrically connected with the connector of the backplane board to a second position wherein the edge connector of the riser card is disengaged from the backplane board connector.

The elongate lever is generally a triangular-shaped member being configured for rotation about the pivot point, the pivot point being connected to the riser card with the attachment means. The upper manipulation region extends upward from the pivot point a sufficient distance as to create sufficient leverage for vertically disengaging the pins connectors of the riser card. Likewise, the lower abutting region extends downward from the pivot point a sufficient distance as to create an interference with the backplane board upon rotation of the lever towards the second disengaged position. The triangular shape of the elongate lever forms a lower abutting region having a narrower cross-section that the lever central region.

The present invention thus provides a simple and ergonomic method for ejecting a riser card from a backplane board. Such an apparatus is mounted to typical riser cards known in the art and does not require an additional bearing surface to be securely mounted on a backplane board. Further, the apparatus only requires a small pulling force to disengage and at least partially remove the riser card from the backplane board.

Other advantages and components of the present invention will become apparent from the following description taken in conjunction with the accompanying drawings, which constitute a part of this specification and wherein are set forth exemplary embodiments of the present invention to illustrate various objects and features thereof.

BRIEF DESCRIPTION OF THE DRAWINGS

FIG. 3 is a side elevational view of the ejector lever of the present invention;

FIG. 4 is a side elevational view of the lever of the present invention showing the lever pivoted to a second disengaged position; and FIG. 5 is a cross-sectional view of the present invention taken along line 5–5 of FIG. 4 showing the pivotable attachment means.

DETAILED DESCRIPTION OF THE INVENTION

Figure 1:
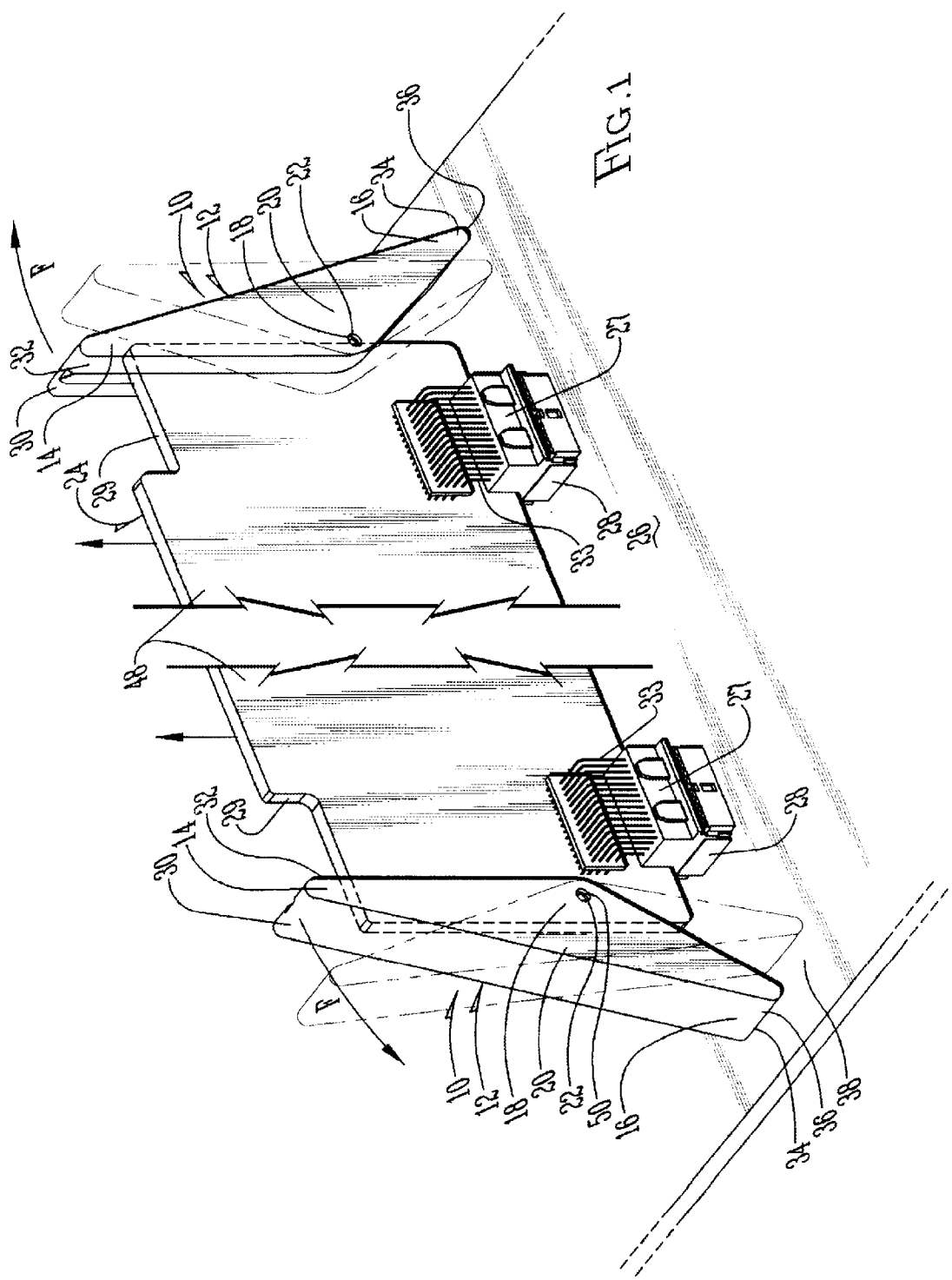
FIG. 1 is a perspective view of an ejector mechanism attached to a riser card, which is seated and in an electrical contact relationship with the electrical connector of the motherboard of the present invention.
Figure 2:
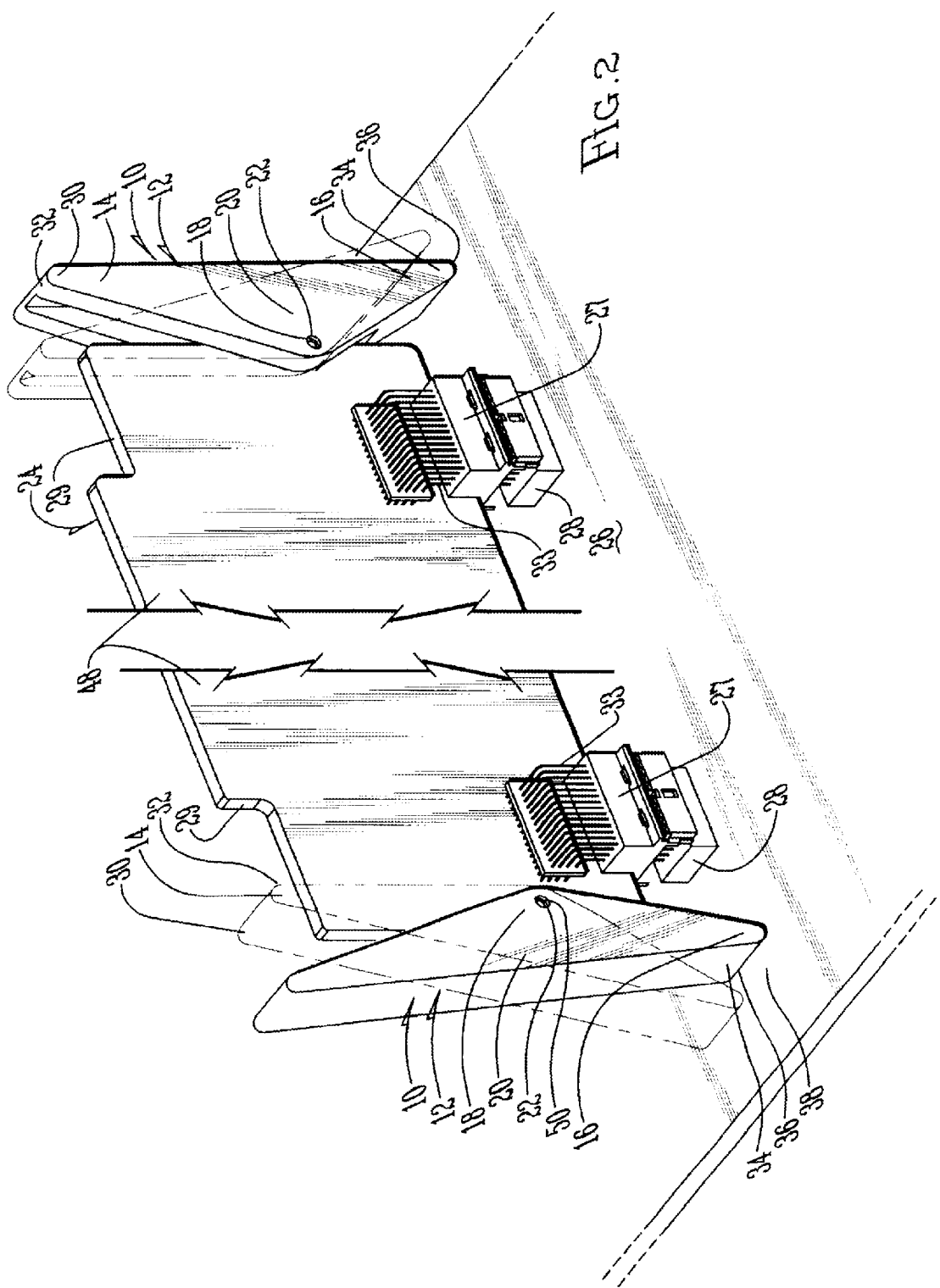
FIG. 2 is a perspective view of the present invention showing the ejector mechanism pivoted to a second disengaged position.

Referring now to the drawing, FIG. 1 is a perspective view of the riser card ejector 10 in accordance with the present invention. The ejection mechanism 10 comprises an elongate lever 12 having an upper manipulation region 14, a lower abutting region 16, and an attachment means 22 for pivotably mounting the lever 12 to a riser card 24. The mechanism 10 is configured to accept a pulling force F to rotate the lever 12 about the attachment means 22 to an abutting position with a backplane board 26 and unseat the edge connector 27 of the attached riser card 24 from a connector 28 of the backplane board 26. Thus, elongate lever 12 of the mechanism 10 can be placed in a first, engaged position wherein the riser card 24 is mateably received and in electrical contact with connector 28 and a disengaged position wherein the riser card 24 is unseated from connector 28 of the backplane board.

The riser card is a generally planar structure having one or more edge connectors mounted to a bottom edge thereof. The edge connectors correspond to an associated electrical connector mounted on the backplane board. The riser card is configured to mount perpendicularly to the backplane board. Further, the riser card 24 is configured with a pair of recesses 29 along its upper edge adjacent each opposing side edge. These recesses provide easy access to the ejector mechanism of the present invention. The connectors, as mounted, require a linear extraction force in the plane of the riser card and outwardly of the backplane board to unseat the edge connector 27 from the connector of the backplane board.

The lever 12 is generally a triangular-shaped member wherein the upper manipulation region 14 is formed substantially at the top of the lever 12, the lower abutting region 16 is formed substantially at the bottom of the lever 12, and the central region 20 is formed in the mid-section of the lever 12. Preferably and as shown in FIG. 5, the lever 12 is generally C-shaped in cross-section having a first leg 42, a second leg 44, and a central bight 40 connecting the first and second leg. As such, the lever 12 is configured to receive a portion of riser card 24 between the first and second leg, 42, 44. Preferably, the lever 12 is made of plastic, but could also be made from other known material that has sufficient rigidity as to provide a levering action for ejecting a riser card 24. The lever 12 is generally mounted on a vertical side of a riser card 24 as mounted to the backplane board such that rotation of the lever 12 is about an axis generally perpendicular to the axis of travel of the riser card 24. For a typical riser card 24 configuration, the elongate lever 12 generally spans the height of the riser card 24.

The upper manipulation region 14 provides a curved manipulation tip 30 formed at the upper edge of the elongate lever 12, and a manipulation surface 32 generally facing the riser card 24. The manipulation tip 30 and surface 32 cooperatively provide a manipulation area in which a user can apply a pulling force F, preferably with a single finger, generally in a direction away from the riser card 24 to rotate the elongate lever 12. Additionally, region 14 extends from the attachment means 22 a sufficient distance as to provide sufficient leverage for vertically disengaging pins 33 of the riser card edge connector from the backplane board connector 28.

The lower abutting region 16 likewise presents a curved engagement tip 34 formed at the lower edge of the lever 12, and an abutting surface 36 generally facing towards the backplane board 26 and the riser card 24 when the lever 12 is placed in the first engaged position. The curved engagement tip 34 is configured to provide a low surface friction for traveling across, and pressing against, a surface 38 of the backplane board 26 as the lower abutting region rotates towards the second disengaged position. The abutting surface 36 is generally a flat, planar surface designed to be positioned directly adjacent the riser card when the lever 12 is placed in the second disengaged position. Preferably the transverse dimension of elongate lever 12 in a plane parallel to the riser card 24 tapers in cross-section from the central region 20 to the lower abutting region 16. This reduced cross-sectional transverse dimension increases the path of translation for the lower abutting region along the backplane board surface 38 thereby maximizing the vertical travel of the pivot point 18 and attached riser card 24.

The attachment means comprises a pair of aligned bores 41 extending through a first surface 42 and a second surface 44 of the lever, and a pin 50 received through the bores 41. The riser card 24 also includes bore 46 extending therethrough configured to align with bores 40 of the lever 12. It is to be understood that any means known in the art for pivotally coupling a lever to a circuit card such as a pin may be used without departing from the scope of the invention. In an alternative configuration, attachment means 22 comprises a male member mounted to one of the riser card 24 or first and second surfaces 42, 44 of lever 12. A female member or bore would be disposed on the opposing structure for mating with the male member. In all configurations, the attachment means 22 can be made of plastic or metal parts, or formed of other materials, so long as they have sufficient durability to withstand forces transmitted from the elongate lever 12 to the riser card 24.

To facilitate the lifting action of the pivot pin 50 and attached riser card 24, the length of the elongate lever 12 between the pivot pin 50 and the curved engagement tip 34 is greater than the vertical clearance from the pivot pin 50 to the backplane board surface 38. Preferably, the pivot pin is positioned on the lever such that as the riser card is seated in the edge connector of the backplane and the lever is in the first position, the engagement tip 34 rests on the surface of the motherboard. In this configuration, the maximum lift will result from pivoting lever from the first position to the second position.

To operate the ejection mechanism 10, a pulling force F is applied to the upper manipulation region 14 of the elongate lever 12 in a traverse direction outwardly from the engaged riser card 24. As the elongate lever 12 begins to rotate around the pivot pin 18, the curved engagement tip 34 of the lower abutting region 16 rotates in a direction opposite of the upper manipulating region 14 and contacts the backplane board surface 38. This contact is facilitated by the pivot pin 50 being mounted at a sufficiently low point on the riser card 24 as to cause the backplane board surface 38 to interfere with the rotation of the lever arm 12. Continued application of the pulling force F causes the curved engagement tip 34 to both press against, and translate along, the backplane board surface 38. Thus, as the lower abutting region 16 moves towards the backplane board connector 28, the continued rotation of the elongate lever 12 forces the pivot pin 50 and thus riser card 24 upwardly. The elongate lever 12 is rotated until the curved engagement tip 34 is positioned directly below the pivot point 18, or until the lever 12 comes into contact with the riser card 24. At this point, the pins 33 of the edge connector 27 are at least partially unseated, and out of electrical contact backplane board connector 28, thereby allowing the riser card 24 to be easily removed from the backplane board 26.

In addition to the applications described above, the current invention can also be used with a variety of circuit card in addition to riser cards, so long as the circuit cards are attached to a connector of another mother board or backplane board. As a further requirement, it is to be understood that the area of the backplane board surface 38 where the curved engagement tip 34 of the elongate lever 12 contacts must be free of any obstructions to allow unimpeded translation of the lower abutting region 16. Thus, the shape of the elongate lever 12 or its mounting location on the riser card 24 may to move the curved engagement tip 34 into an unobstructed region of the backplane board surface 38. For example, the elongate lever 12 can be mounted on either face 48 of the riser card 24.

From the forgoing information, it should now be obvious that the riser card ejection mechanism 10 provides a more ergonomic, simple, and universal solution for disengaging a circuit card from a backplane board. The present invention can be provided with any number of standard riser card configurations and does not require a raised push-off surface to be provided on the backplane board. While certain forms of the present invention have been illustrated and described herein, it is not to be limited to the specific forms or arrangement of parts described and shown.

What is claimed is:

1. An ejection mechanism for a circuit card, the circuit card having an upper edge, a bottom edge, opposite side edges, and at least one edge connector mounted to the bottom edge and mateably received in an electrical connector of a backplane board, one of said bottom edge and said edge connector of said circuit card defining a lowermost longitudinal axis, the ejection mechanism comprising:

at least one elongate lever pivotably mounted to a side edge of the circuit card and movable from a first position wherein the edge connector is seated in the electrical connector and a second position wherein the edge connector is unseated, the lever having an upper manipulation region for receiving an input force and a lower abutting region for contacting the backplane board;

an attachment means for pivotably securing the elongate lever to the circuit card, the attachment means being mounted to the circuit card such that as the at least one lever is pivoted from the first position to the second position, the lower abutting region extends below the lowermost longitudinal axis of the circuit card whereby as the circuit card is mounted to the backplane board and the lever is pivoted from the first position to the second position, the lower abutting region engages the backplane board and exerts a upward force on the circuit card.

2. The ejection mechanism of claim 1, wherein the at least one elongate lever comprises two levers mounted on opposite side edges of the circuit card.

3. The ejection mechanism of claim 1, wherein the force applied to the upper manipulation arm causes the elongate lever to pivot in a plane defined by the circuit card and outwardly away from the circuit card.

4. The ejection mechanism of claim 1, wherein the lower abutting region translates across a top surface of the backplane board.

5. The ejection mechanism of claim 1, wherein the circuit card includes a recess on the upper edge and wherein the upper manipulation region extends adjacent to the recess for facilitating the pivoting of the at least one lever.

6. The ejection mechanism of claim 5, wherein the at least one lever comprises two levers and wherein the circuit card includes two recesses on the upper edge.

7. The ejection mechanism of claim 1, wherein the attachment means comprises a bore extending through the elongate lever in a direction perpendicular to the plane of the circuit card, and a pin mateably received in the bore.

8. The ejection mechanism of claim 7, wherein the circuit card comprises a bore aligned with the bores of the lever and being configured to mateably receive the pin.

9. The ejection mechanism of claim 1, wherein the lower abutting region has a curved engagement surface configured to minimize frictional contact with the backplane board.

10. The ejection mechanism of claim 1, wherein the lever has a longitudinal dimension extending substantially the height of the circuit card.

11. The ejection mechanism of claim 1, wherein the lever is generally channel-shaped in transverse cross-section and comprises a first leg, a second leg, and a central bight.

12. The ejection mechanism of claim 11, wherein the lever defines a channel, a portion of the circuit card being received in the channel.

13. A method for ejecting a circuit card from a backplane board, the circuit card having an edge connector mateably received in an electrical connector mounted on the backplate board, the method comprising the steps of:

providing a pivotable lever on a side edge of the circuit card, the lever having a lower abutment region in contact with the backplane board and being pivotable to move the abutment region against the backplane board to provide a lifting force;

pivoting the lever from a first position in which the edge connector is seated in the electrical connector of the backplane board to a second position in which the edge connector is unseated from the electrical connector.

14. The method of claim 13, wherein an upper manipulation region of the lever is pivoted outwardly away from the circuit card.

15. A mechanism for moving a circuit card out of electrical connection with a backplane board comprising:

a lever arm having an upper manipulation region and a lower abutting region, the lower abutting region extending downward a sufficient distance as to be substantially adjacent to a bottom edge of the circuit card;

a pivot disposed on the lever arm between the upper manipulation region and the lower abutting region for mounting the lever arm to the circuit card, wherein a span of the lever from the pivot to the lower abutting region being greater than a span from the pivot to the backplane board such that as the lever rotates about the pivot, the attached circuit card is lifted upward and out of electrical connection with the backplane board.

16. The mechanism of claim 15, whereby the force applied to the upper manipulation region is applied in a direction away from the circuit card.

17. The mechanism of claim 15, wherein the elongate lever has a longitudinal dimension extending substantially the height of the circuit card.

\* \* \* \* \*